(12) United States Patent
Takahashi et al.

(10) Patent No.: US 8,426,107 B2
(45) Date of Patent: Apr. 23, 2013

(54) POSITIVE-TYPE PHOTOSENSITIVE COMPOSITION

(75) Inventors: Motoki Takahashi, Kawasaki (JP); Toshiyuki Ogata, Kawasaki (JP); Christopher Cordonier, Nagoya (JP); Akimasa Nakamura, Nagoya (JP); Tetsuya Shichi, Nagoya (JP); Teruhiro Uematsu, Kawasaki (JP)

(73) Assignees: Tokyo Ohka Kogyo Co., Ltd., Kawasaki-shi (JP); Central Japan Railway Company, Nagoya-shi (JP)

( * ) Notice: Subject to any disclaimer, the term of this patent is extended or adjusted under 35 U.S.C. 154(b) by 0 days.

(21) Appl. No.: 12/991,690

(22) PCT Filed: May 13, 2009

(86) PCT No.: PCT/JP2009/058937
§ 371 (c)(1),
(2), (4) Date: Nov. 8, 2010

(87) PCT Pub. No.: WO2009/139421
PCT Pub. Date: Nov. 19, 2009

(65) Prior Publication Data
US 2011/0064913 A1    Mar. 17, 2011

(30) Foreign Application Priority Data

May 14, 2008  (JP) ................................ 2008-126793

(51) Int. Cl.
G03F 7/00 (2006.01)
G03F 7/004 (2006.01)
B32B 3/10 (2006.01)

(52) U.S. Cl.
USPC .................. 430/270.1; 430/913; 428/156

(58) Field of Classification Search .............. 430/270.1, 430/913; 428/156
See application file for complete search history.

(56) References Cited

U.S. PATENT DOCUMENTS

| 7,498,117 | B2 * | 3/2009 | Dorogy et al. | 430/292 |
| 7,754,413 | B2 * | 7/2010 | Kasperchik et al. | 430/270.1 |
| 7,771,781 | B2 * | 8/2010 | Kawakami | 427/162 |
| 2009/0324963 | A1 * | 12/2009 | Cordonier et al. | 428/426 |

FOREIGN PATENT DOCUMENTS

| JP | H09-237518 | 9/1997 |
| JP | H09-263969 | 10/1997 |
| JP | H11-256342 | 9/1999 |
| JP | H11-278869 | 10/1999 |
| JP | 2001-143526 | 5/2001 |
| JP | 2002-015631 | 1/2002 |
| JP | 2002-358824 | 12/2002 |
| JP | 2003-255522 | 9/2003 |
| JP | 2006-344479 | 12/2006 |
| WO | WO 2008/007451 | 1/2008 |
| WO | WO2008/007469 | 1/2008 |
| WO | WO2008/007751 | 1/2008 |

OTHER PUBLICATIONS

Machine translation of JP 11-256342 (no date).*
Machine translation of 11-228113(no date).*
Machine translation of JP 2001-143526 (no date).*
Machine translation of JP 2006-019249 (no date).*
Machine translation of JP 2006-344479 (no date).*
The International Search Report issued in corresponding PCT Application No. PCT/JP2009/058937, mailed Jun. 9, 2009.
Office Action issued in corresponding Korean Patent Application No. KR10-2010-7027561 on Sep. 3, 2012.
Notice of Reasons for Rejection issued to JP Application No. 2010-512005, dated Aug. 21, 2012.

* cited by examiner

*Primary Examiner* — Amanda C. Walke
(74) *Attorney, Agent, or Firm* — Knobbe Martens Olson & Bear LLP

(57) ABSTRACT

Disclosed is a positive-type photosensitive composition which can form a metal compound film pattern at high resolution and with less affection by organic residues. The positive-type photosensitive composition comprises: a metal complex component (A) which can form a metal compound film when applied and subsequently fired; and a photosensitizing agent (B). In the composition, a ligand in the component (A) is preferably a multidentate ligand having an aromatic compound as its skeleton. According to this construction, even a composition containing substantially no photosensitive resin can impart photosensitivity and a metal compound film pattern can be formed readily.

14 Claims, No Drawings

POSITIVE-TYPE PHOTOSENSITIVE COMPOSITION

RELATED APPLICATIONS

This application is the U.S. National Phase filing under 35 U.S.C. §371 of PCT/JP2009/058937, filed May 13, 2009, which designated the United States and was published in a language other than English as PCT WO2009/139421 on Nov. 19, 2009, which claims priority under 35 U.S.C. §119 (a)-(d) to Japanese Patent Application No. 2008-126793, filed May 14, 2008. The contents of these applications are incorporated herein by reference in their entireties.

TECHNICAL FIELD

The present invention relates to a positive-type photosensitive composition used in the formation of a metal compound film pattern.

BACKGROUND ART

A known method of formation of a conductive film typically using metal oxides such as ITO and the like includes coating a coating liquid including a metal complex onto a surface of a substrate, and thereafter, subjecting the metal complex to thermal decomposition by baking to thereby form a metal oxide thin film. A ligand in the metal complex often employs a multidentate ligand including ethylene diamine tetraacetic acid, diethanolamine, acetylacetone, or the like and having two or more substitution groups in the molecule such as hydroxyl groups or amino groups. Other ligands that improve adhesive performance or anti-cracking properties are known to include use of a multidentate ligand that has a specific aromatic skeleton (Refer to Patent Document 1).

On the other hand, a method of pattern formation of the above type of conductive film executes pattern formation on the conductive film by forming a resist pattern on a flat conductive film, and then transfers the resist pattern using etching. However in recent years, shortening of this process has been examined in relation to imparting photosensitivity to the coating liquid itself and then directly executing pattern formation. For example, direct pattern formation has been disclosed that uses a photosensitive transparent conductive film-forming coating liquid containing a solvent, a photosensitive resin and a chelate complex coordinating organic ligands in a hydroxy compound produced from an organic acid and a compound containing indium and tin (Refer to Patent Document 2).

Patent Document 1: International Publication No. 2008/007751
Patent Document 2 Japanese Unexamined Patent Application, Publication No. 2001-143526

DISCLOSURE OF THE INVENTION

Problems to be Solved by the Invention

The coating liquid discussed in Patent Document 2 must contain a known conventional photosensitive resin to enable pattern formation. However due to the fact that an amount of the photosensitive resin must be sufficient to impart photosensitive properties, the presence of the resin has an effect on the final formation amount of the metal compound film. In other words, problems have arisen in association with a reduction in the mechanical strength, transparency and conducting properties due to the adverse effect on the uniformity and denseness of the final metal compound film resulting from the decrease in the metal content amount corresponding to the photosensitive resin amount.

Furthermore it is desirable that the photosensitive resin is finally decomposed in the baking step and is not present at all in the film. However when a polymer resin is present in the coating liquid, even after baking, a portion of the resin remains as an organic residue, and there is a risk of an adverse effect on the film properties. In order to completely eliminate the effect of the residue, it is preferred to impart photosensitivity using a composition that substantially does not contain a polymer resin.

The present invention is proposed in light of the above problems and has the object of providing a positive-type photosensitive composition that exhibits excellent conductivity in a patterned metal compound film and low effects caused by organic residues.

Means for Solving the Problems

The present inventors completed the present invention with the insight that pattern formation of a metal compound film is enabled by a positive-type photosensitive composition imparted with a low-molecular weight photosensitizing agent in a metal complex component enabling formation of a metal compound film by processing including a baking step.

In other words, the present invention provides a positive-type photosensitive composition including a metal complex component (A) enabling formation of a metal compound film by processing including a baking step, and a photosensitizing agent (B).

Effects of the Invention

According to the present invention, a patterned metal compound film can be also formed when using a composition substantially not containing a photosensitive resin.

PREFERRED MODE FOR CARRYING OUT THE INVENTION

The positive-type photosensitive composition according to the present invention must include a metal complex component (A) enabling formation of a metal compound film by post-coating processing (hereinafter referred to as "component (A)"), and a photosensitizing agent (B) (hereinafter referred to as "component (B)", and preferably further includes a solvent (D) (hereinafter referred to as "component (D)"). The respective components will be described below.

Metal Complex Component (A)

The component (A) is a metal complex component enabling formation of a metal compound film by post-coating processing. In other words, any metal complex component may be used without limitation if such metal complex component enables formation of a metal compound film by coating of a liquid containing the metal complex on a surface of a substrate, and thereafter, thermally decomposing the metal complex by baking. More specifically, the metal complex components disclosed in Japanese Unexamined Patent Application, Publication Nos. H09-278489, H11-228113 and H11-256342 may be used. A ligand in the metal complex may employ a multidentate ligand including ethylene diamine tetraacetic acid, diethanolamine, acetylacetone, oxalic acid, or the like and having two or more substitution groups in the molecule such as hydroxyl groups or amino groups.

Furthermore the ligand of the component (A) preferably is a multidentate ligand having an aromatic compound as its skeleton. More preferably, the aromatic compound is an aromatic hydrocarbon that may include a substitution group, or a heteroaromatic compound that may include a substitution group. Still more preferably, the aromatic hydrocarbon or the heteroaromatic compound includes at least one compound selected from a group consisting of a five-membered cyclic compound, a six-membered cyclic compound, and a condensed ring compound of these compounds. As used herein, an aromatic hydrocarbon is a cyclic compound configured of a ring of only carbon atoms, and a heteroaromatic compound is a cyclic compound having a cyclic atomic configuration of hetero atoms including oxygen, nitrogen and sulfur in addition to carbon atoms. In addition to a monocyclic compound, the compound may be a condensed ring compound. There is no particular limitation on the number of rings in the condensed ring compound, however bicyclic compounds are preferred. Furthermore the condensed ring compound may be formed from 6-membered rings, or 5-membered rings, or may be a condensed ring compound of a 5-membered ring and a 6-membered ring.

More specifically, the component (A) is preferably at least one compound selected from the group consisting of a metal complex $A_1$ represented by Formula 1 below, a metal complex $A_2$ represented by Formula 2 below, a metal complex $A_3$ represented by Formula 3 below, a metal complex $A_4$ represented by Formula 4 below, and a metal complex $A_5$ represented by Formula 5 below.

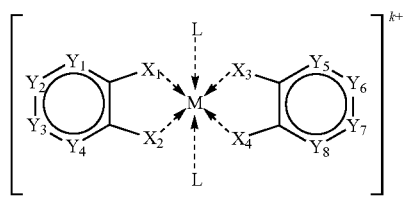

Formula 1

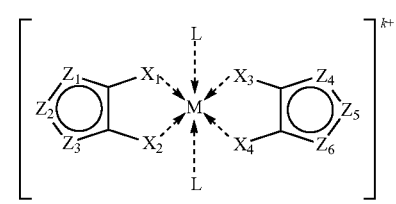

Formula 2

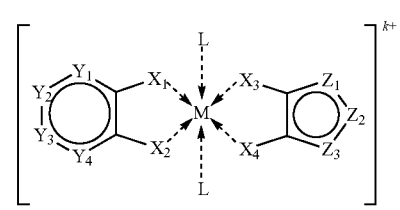

Formula 3

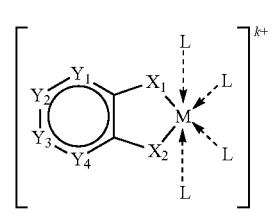

Formula 4

-continued

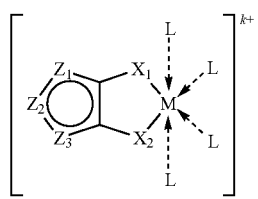

Formula 5

M in Formula 1 to Formula 5 represents a metal ion, $X_1$-$X_4$ in Formula 1 to Formula 3, and $X_1$-$X_2$ in Formula 4 to Formula 5 respectively represent any of O, NH, $CO_2$, and S. $Y_1$-$Y_8$ in Formula 1, and $Y_1$-$Y_4$ in Formula 3 to Formula 4 respectively represent any of CH, N, O, and a carbon atom having a substitution group. When carbon atoms are such that $Y_1$—$Y_8$ are adjacent, the adjacent carbon atoms may be in the formation of a condensed ring. $Z_1$-$Z_3$ in Formula 2, Formula 3, and Formula 5, and $Z_4$-$Z_6$ in Formula 2 are respectively configured from one member selected from the group consisting of O, NH, and S, and two members selected from the group consisting of CH, N, O, and a carbon atom having a substitution group. When carbon atoms are such that $Z_1$-$Z_6$ are adjacent, the adjacent carbon atoms may be in the formation of a condensed ring. L in Formula 1 to Formula 5 represents an axial ligand. k in Formula 1 to Formula 5 represents the valence of the metal complex, and is equal to the total of the charges of M, $X_1$-$X_4$, and L.

Metal complex $A_1$ in Formula 1 above is particularly preferred of the metal complexes shown in Formula 6 to Formula 13.

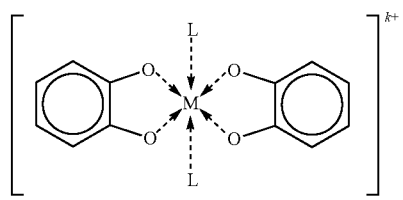

Formula 6

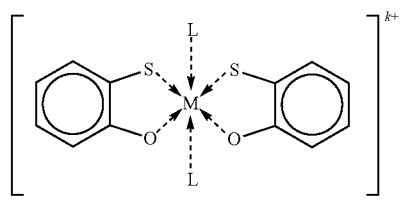

Formula 7

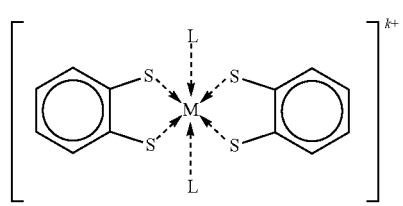

Formula 8

Formula 9

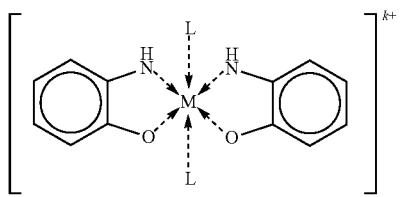

Formula 10

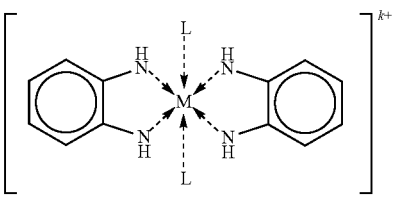

Formula 11

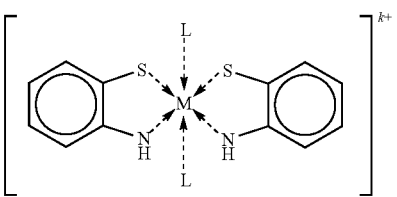

Formula 12

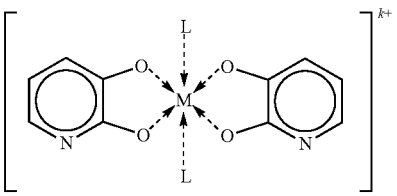

Formula 13

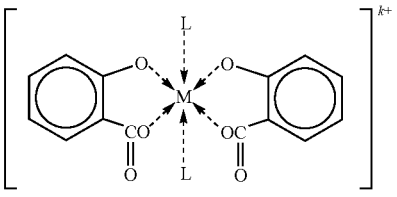

In Formula 7, $X_1$ and $X_3$ represent S, $X_2$ and $X_4$ represent O. However in addition, $X_1$ and $X_4$ may represent S, and $X_2$ and $X_3$ may represent O, or $X_1$ and $X_2$ may represent S, and $X_3$ and $X_4$ may represent O, or only one of $X_1$ to $X_4$ may represent S, and the others may represent O, or only one of $X_1$ to $X_4$ may represent O, and the others may represent S. In the same manner, in Formulae 9, 11, and 13, the combination of $X_1$ to $X_4$ may be varied as described above.

In Formula 12, $Y_4$ and $Y_8$ represent N, $Y_1$-$Y_3$ and $Y_5$-$Y_7$ represent CH. However in addition, $Y_1$ and $Y_8$ may represent N, $Y_2$-$Y_7$ may represent CH.

The metal complex $A_4$ for example may be any of the metal complexes shown in Formulae 14-21.

Formula 14

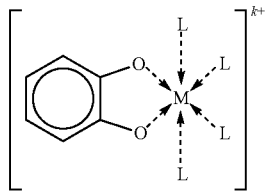

Formula 15

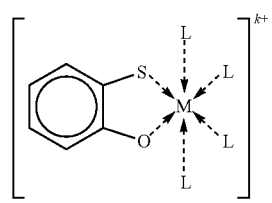

Formula 16

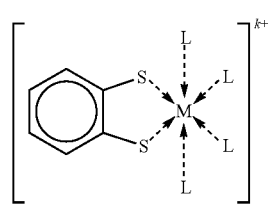

Formula 17

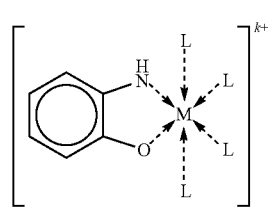

Formula 18

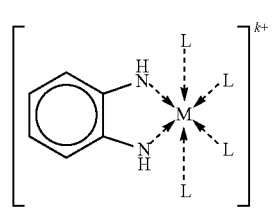

Formula 19

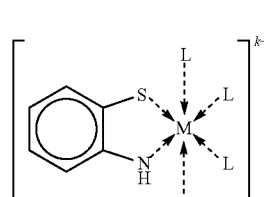

Formula 20

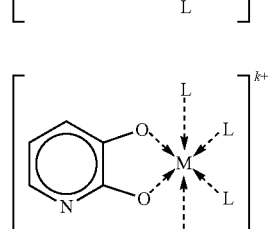

Formula 21

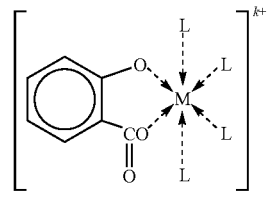

The metal complex $A_2$ for example may be any of the metal complexes shown in Formulae 22-25.

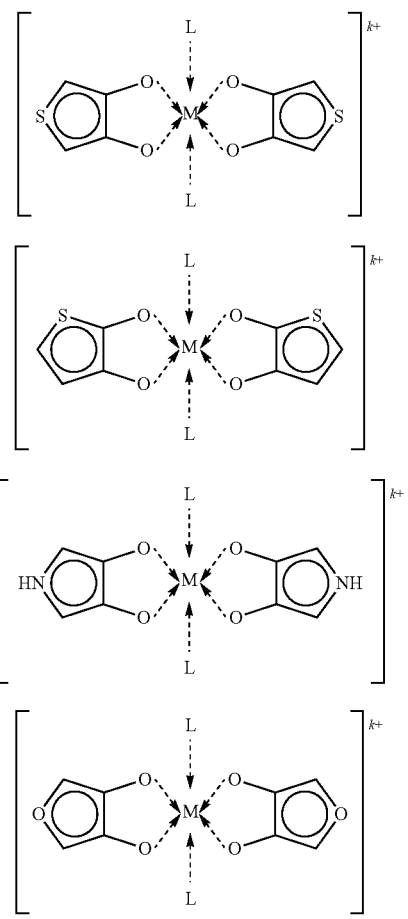

Formula 22

Formula 23

Formula 24

In Formula 23, $Z_1$ and $Z_4$ represent S, $Z_2$-$Z_3$ and $Z_5$-$Z_6$ represent CH. However in addition, $Z_1$ and $Z_6$ may represent S, and $Z_2$-$Z_5$ may represent CH.

The metal complex $A_3$ for example may be any of the metal complexes shown in Formulae 26-27.

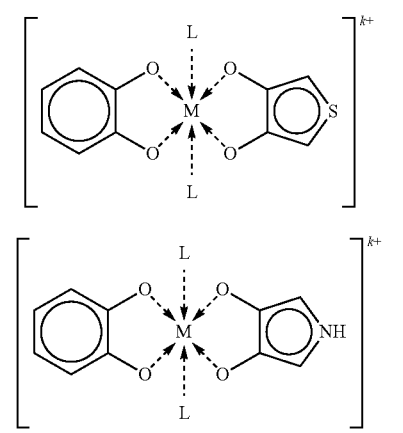

Formula 26

Formula 27

It is preferred that at least one of $Y_1$-$Y_8$ in Formula 1, or at least one of $Y_1$-$Y_4$ in Formula 3 to Formula 4 is a carbon atom having a substitution group and it is preferred that the adjacent carbon atoms in $Y_1$-$Y_8$ form a condensed ring. Also, It is preferred that at least one of $Z_1$-$Z_3$ in Formula 2, Formula 3 and Formula 5, or at least one of $Z_4$-$Z_5$ in Formula 2 is a carbon atom having a substitution group and it is preferred that the adjacent carbon atoms in $Z_1$-$Z_6$ form a condensed ring.

For example it is preferred that the metal complex $A_1$ is the metal complex shown in Formula 28 below and it is preferred that the metal complex $A_4$ is the metal complex shown in Formula 29 below.

Formula 28

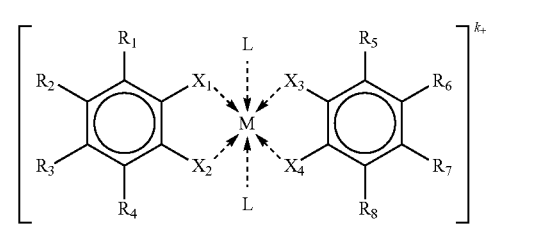

Formula 29

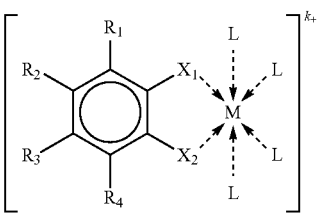

At least one of $R_1$ to $R_8$ in Formula 28, and at least one of $R_1$ to $R_4$ in Formula 29 is the substitution group described above. More precisely, examples include an alkyl group having no more than 20 carbon atoms such as a methyl group (—$CH_3$), an ethyl group (—$C_2H_5$), a t-butyl group (—$C(CH_3)_3$), or the like; an amino-alkyl group in which a part of the carbon atoms of the alkyl group are substituted with nitrogen atoms; a cyano group (—CN); and a carbonyl group such as an aldehyde (—CHO), a ketone (—COR), a carboxylic group (—COOH), an ester (—COOR), and amide (—CONRR'); and the like. Of these groups, a group that includes a carbonyl group except for carboxylic group is preferred in view of solubility in an organic solvent. There is no particular limitation on the bonding position of the substitution group, but it is preferred that at least one of $R_2$, $R_3$, $R_6$, and $R_7$ is the substitution group described above.

Precise examples of these types of ligand are shown in Formulae 30 to 37 below.

Formula 30

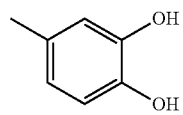

Formula 31

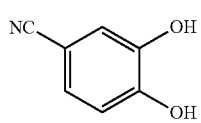

Formula 32

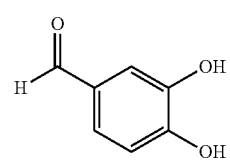

Formula 33

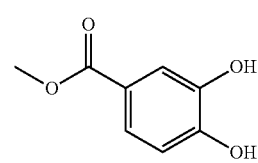

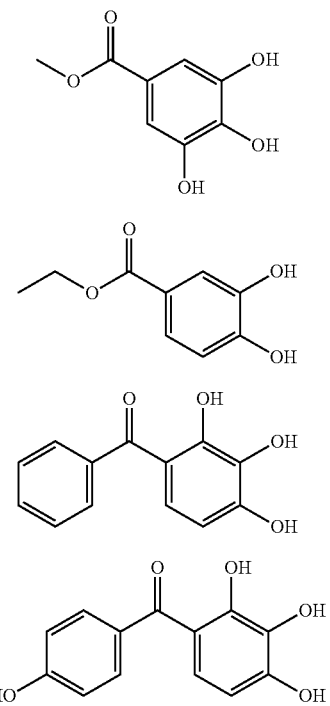

Formula 34

Formula 35

Formula 36

Formula 37

A condensed ring may be formed between adjacent substitution groups from $R_1$ to $R_8$ in Formula 28, and between adjacent substitution groups from $R_1$ to $R_4$ in Formula 29. The condensed ring may include yet another substitution group. An actual example is shown in Formula 38 or Formula 39 below.

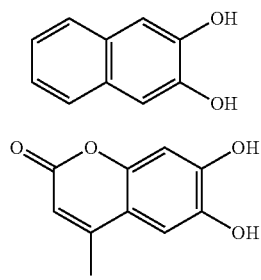

Formula 38

Formula 39

Any multidentate ligand having an aromatic compound as its skeleton according to the present invention may be used if it has a stable resonance structure. Thus the ligand shown below for example may be suitably used within the scope of the present invention. Since the structural formula (a) and (b) of the ligand in Formula 40 forms a resonance structure, the ligand having the structural formula (a) can be used in the scope of the present invention.

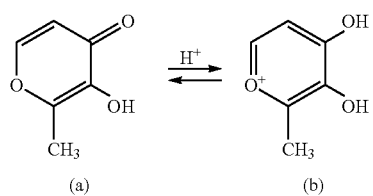

Formula 40

The metal M includes for example Al, Si, Ti, V, Cr, Mn, Fe, Co, Ni, Cu, Zn, Ga, Zr, Nb, In, Sn, Eu, Ta, Pb, and the like. M may be a single type of metal or may be a mixture of two or more metals.

The compounds in Formulae 1 to 3, 6 to 13, and 22 to 27 are known, and may be manufactured using the method discussed in Patent Document 2. Depending on the type of the metal M, it is possible to manufacture the compound shown in Formula 4 using the method of manufacture of the compound shown in Formula 1 discussed in Patent Document 2. In the same manner, it is possible to manufacture the compound in Formula 5 using the method of manufacture for the compound shown in Formula 2, and it is possible to manufacture the compounds in Formulae 14 to 21 using the method of manufacture for the compounds shown in Formulae 6 to 13. The ligands shown in Formulae 30 to 40 are known, or may be simply manufactured.

Component (A) configured as shown in Formulae 1 to 29 above prevents cracking when forming a metal compound film pattern as described below, and demonstrates excellent adhesion to the substrate. The absence of cracking enables an increase in the film thickness of the metal compound film pattern. Furthermore a high-resolution and compact pattern can be formed.

The reason for an absence of crack formation is conjectured to be as follows. The metal complex described above has a flat structure as clearly shown from the molecular structure expressed in Formulae 1 to 3, and Formula 4 and 5. Therefore when forming a coated film by coating a coating liquid onto the substrate, a molecular assembly structure (stacking) is formed by a laminated configuration of metal complexes caused by an interaction between the metal complexes. An interaction between the aromatic rings included in the ligands also participates in the formation of the molecular assembly structure. In this manner, even when the ligand is consumed during baking, volume contraction in a planar direction on the surface of the substrate is suppressed, and therefore cracking and peeling is suppressed.

The component (A) is preferably an alkali-soluble component. In this manner, pattern formation is enabled by a conventional known alkali development. In this context, component (A) as shown in Formula 1 to 29 shows a preferred configuration in which all of $X_1$ to $X_4$ is O or when both oxygen atoms and ester bonds are present.

Photosensitizing Agent (B)

The characteristic of the present invention is the feature of imparting positive photosensitive properties by addition of a photosensitizing agent component (B). There is no particular limitation on component (B), and the component (B) may be applied as any of a non-chemically amplifying system that functions as a dissolution inhibitor, or component (B) may be a photosensitive acid generator, and may be a chemically amplifying system including a dissolution inhibitor as component (C).

It is preferred that the photosensitizing agent (B) in a non-chemically amplifying system increases solubility of component (A) with respect to alkali solutions (for example, an aqueous solution of tetramethyl ammonium hydroxide (TMAH)) resulting from irradiation of ultraviolet light or the like, and a compound containing a quinone diazide group is preferred.

Actual examples of a compound containing a quinone diazide group include for example a compound including a complete esterification or partial esterification product of a compound containing a phenolic hydroxyl group and a compound containing naphthoquinone diazide sulfonic acid.

Actual examples of the compound containing phenolic hydroxyl groups include polyhydroxybenzophenone compounds such as 2,3,4-trihydroxybenzophenone, 2,3,4,4'-tetrahydroxybenzophenone; trisphenol compounds such as tris(4-hydroxyphenyl)methane, bis(4-hydroxy-3- methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenyl methane, bis(5-cyclohexyl-4-hydroxy-2-methylphenyl)-3-hydroxyphenyl methane, bis(5-cyclohexyl-4-hydroxy-2-methylphenyl)-2-hydroxyphenyl methane, bis(5-cyclohexyl-4-hydroxy-2-methylphenyl)-3,4-dihydroxy phenylmethane, or the like;

linear trinuclear phenol compounds such as 2,4-bis(3,5-dimethyl-4-hydroxybenzyl)-5-hydroxyphenol, 2,6-bis(2,5-dimethyl-4-hydroxybenzyl)-4-methylphenol, or the like;

linear tetranuclear phenol compounds such as 1,1-bis[3-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, bis[2,5-dimethyl-3-(2-hydroxy-5-methylbenzyl)-4-hydroxyphenyl]methane, or the like;

linear polyphenol compounds such as linear pentanuclear phenol compounds including 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, 2,6-bis[2,5-dimethyl-3-(2-hydroxy-5-methylbenzyl)-4-hydroxybenzyl]-4-methylphenol, or the like;

bisphenol compounds such as bis(2,3-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, 2-(2,3,4-trihydroxyphenyl)-2-(4'-hydroxy-3',5'-dimethylphenyl)propane, or the like;

multinuclear branched compounds such as 1-[1-(4-hydroxyphenyl)isopropyl]-4-[1,1-bis(4-hydroxyphenyl)ethyl]benzene 1-[1-(3-methyl-4-hydroxyphenyl)isopropyl]-4-[1,1-bis(3-methyl-4-hydroxyphenyl)ethyl]benzene, or the like; and condensed phenol compounds such as 1,1-bis(4-hydroxyphenyl)cyclohexane. These phenol compounds can be used alone or in combination of two or more.

Further, examples of a naphthoquinonediazide sulfonic acid compound include naphthoquinone-1,2-diazide-5-sulfonic acid, naphthoquinone-1,2-diazide-4-sulfonic acid, and the like.

Further, it is possible to use other quinonediazide-group-containing compounds, for example, orthobenzoquinonediazide, orthonaphthoquinonediazide, orthoanthraquinonediazide or nuclear substitution derivatives thereof, such as orthonaphthoquinonediazide sulfonic ester;

and products of a reaction between orthoquinonediazide sulfonyl chloride and a compound having a hydroxyl group or an amino group (for example, phenol, p-methoxyphenol, dimethylphenol, hydroquinone, bisphenol A, naphthol, pyrocatechol, pyrogallol, pyrogallol monomethyl ether, pyrogallol-1,3-dimethyl ether, gallic acid, gallic acid esterified or etherified with partially residual hydroxyl groups, aniline, p-aminodiphenylamine, or the like). These compounds may be used alone or in combination of two or more.

These quinonediazide-group containing compounds can be prepared by condensing the trisphenol compound and naphthoquinone-1,2-diazide-5-sulfonyl chloride or naphthoquinone-1,2-diazide-4-sulfonyl chloride in an appropriate solvent such as dioxane in the presence of an alkali such as triethanolamine, alkali carbonate, alkali hydrogen carbonate, or the like and by fully or partially esterifying the condensate. The compound containing a quinone diazide group is preferably this type of naphthoquinone diazide sulfonic acid esterification product.

The proportion of component (B) to component (A) is preferably 40 mass % or less, more preferably 20 mass % or less, and most preferably 10 mass % or less. In this manner, the present invention is characterized by imparting sufficient photosensitizing properties by a small addition amount in comparison with conventional systems that use photosensitive resins.

The photosensitizing agent (B) in the chemically amplifying system is a photosensitive acid generator, and furthermore includes component (C) as a dissolution inhibitor. Component (C) is a compound that has the effect of suppressing alkali solubility of component (A) and in which protective groups in the dissolution inhibitor dissociate due to the action of acid produced by component (B) as a result of irradiation.

In other words, alkali solubility before exposure of the resist film obtained by using the positive photosensitive composition is suppressed by formulation of component (C) into the positive-type photosensitive composition according to the present invention. Consequently, when selectively exposing the resist film, the difference in alkali solubility between the exposed portion and the non-exposed portion (the solubility contrast) increases, and a resist pattern can be formed with superior resolution or shape.

When component (A) is a component that has an acid-cleavable dissolution inhibiting group, the dissolution inhibitor represented by component (C) can be used as an added agent to a chemically amplifying resist composition using a two-component system including component (A) and a photosensitive acid generator (component (B)). When component (A) is a component that does not include an acid-cleavable dissolution inhibiting group, component (A) may be formulated with a photosensitive acid generator (component (B)) together with component (C), that is to say, use is possible as a chemically amplifying resist composition using a three-component system.

Examples of a photosensitive acid generator include known acid generators such as onium salts, diazomethane derivatives, glyoxime derivatives, bissulfone derivatives, β-ketosulfone derivatives, disulfone derivatives, nitrobenzyl sulfonate derivatives, sulfonic acid ester derivatives, sulfonic acid ester derivatives of an N-hydroxyimide compound, or the like.

Specific examples of the onium salt include tetramethylammonium trifluoromethanesulfonate, tetramethylammonium nonafluorobutanesulfonate, tetra n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl) sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbonyl)methyl(2-oxocyclohexyl)sulfonium trifluoromethanesulfonate, ethylenebis[methyl(2-oxocyclopentyl)sulfonium trifluoromethanesulfonate], 1,2'-naphthylcarbonylmethyltetrahydrothiophenium triflate, and the like.

Examples of the diazomethane derivative include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl) diazomethane, bis(n-butylsulfonyl)diazomethane, bis(isobutylsulfonyl)diazomethane, bis(sec-butylsulfonyl) diazomethane, bis(n-propylsulfonyl)diazomethane, bis (isopropylsulfonyl)diazomethane, bis(tert-butylsulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, 1-tert-amylsulfonyl-1-(tert-butylsulfonyl)diazomethane, and the like.

Examples of the glyoxime derivative include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-β-(xylenesulfonyl)-α-dimethylglyoxime, bis-O-(camphorsulfonyl)-α-dimethylglyoxime, and the like.

Examples of the aforementioned bissulfone derivative include bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, bisbenzenesulfonylmethane, and the like.

Examples of the aforementioned β-ketosulfone derivative include 2-cyclohexylcarbonyl-2-(p-toluenesulfonyl)propane, 2-isopropylcarbonyl-2-(p-toluenesulfonyl)propane, and the like.

Examples of the disulfone derivative include disulfone derivatives such as diphenyldisulfone derivatives, dicyclohexyldisulfone derivative, and the like.

Examples of the aforementioned nitrobenzylsulfonate derivative include nitrobenzylsulfonate derivatives such as 2,6-dinitrobenzyl p-toluenesulfonate, 2,4-dinitrobenzyl p-toluenesulfonate, and the like.

Examples of the aforementioned sulfonic acid ester derivative include sulfonic acid ester derivatives such as 1,2,3-tris(methanesulfonyloxy)benzene, 1,2,3-tris(trifluoromethanesulfonyloxy)benzene, 1,2,3-tris(p-toluenesulfonyloxy) benzene, and the like.

Examples of the aforementioned sulfonic acid ester derivative of an N-hydroxyimide compound include N-hydroxysuccinimide methanesulfonate ester, N-hydroxysuccinimide trifluoromethanesulfonate ester, N-hydroxysuccinimide ethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide 1-octanesulfonate ester, N-hydroxysuccinimide p-toluenesulfonate ester, N-hydroxysuccinimide p-methoxybenzenesulfonate ester, N-hydroxysuccinimide 2-chloroethanesulfonate ester, N-hydroxysuccinimide benzenesulfonate ester, N-hydroxysuccinimide 2,4,6-trimethylbenzenesulfonate ester, N-hydroxysuccinimide 1-naphthalenesulfonate ester, N-hydroxysuccinimide 2-naphthalenesulfonate ester, N-hydroxy-2-phenyl succinimide methanesulfonate ester, N-hydroxymaleimide methanesulfonate ester, N-hydroxymaleimide ethanesulfonate ester, N-hydroxy-2-phenylmaleimide methanesulfonate ester, N-hydroxyglutarimide methanesulfonate ester, N-hydroxyglutarimide benzenesulfonate ester, N-hydroxyphthalimide methanesulfonate ester, N-hydroxyphthalimide benzenesulfonate ester, N-hydroxyphthalimide trifluoromethanesulfonate ester, N-hydroxyphthalimide p-toluenesulfonate ester, N-hydroxynaphthalimide methanesulfonate ester, N-hydroxynaphthalimide benzenesulfonate ester, N-hydroxy-5-norbornene-2,3-dicarboxylmide methanesulfonate ester, N-hydroxy-5-norbornene-2,3-dicarboxylmide trifluoromethanesulfonate ester, N-hydroxy-5-norbornene-2,3-dicarboxylmide p-toluenesulfonate ester, and the like.

These photosensitive acid generators can be used singly or as a combination of two or more. The addition amount of the photosensitive acid generator is preferably in a range of 0.1 mass % to 50 mass % relative to component (A).

It is preferred that component (C) is a low-molecular weight compound that has an acid-cleavable dissolution inhibiting group, and that the acid-cleavable dissolution inhibiting group dissociates due to the action of an acid. The molecular weight of component (C) is preferably 3000 or less, and more preferably 500-2000.

Component (C) may be a known dissolution inhibitor already used in a chemically amplifying positive resist composition, and for example, includes a phenol compound in which a phenolic hydroxyl group is protected by the acid-cleavable dissolution inhibiting group, or a carboxy compound in which a carboxy group is protected by the acid-cleavable dissolution inhibiting group. As used herein, "protected" means that at least one of the phenolic hydroxyl group or the hydroxyl group of the carboxy group is substituted by the acid-cleavable dissolution inhibiting group.

A phenol compound including a phenolic hydroxyl group configuring component (C) by protecting with the acid-cleavable dissolution inhibiting group includes for example a polyphenol compound having 3-5 phenolic groups, for example a nuclear substitution derivative thereof, such as triphenyl methane compounds, bis(phenylmethyl)diphenyl methane compounds, 1,1-diphenyl-2-biphenyl ethane compounds, or the like. Furthermore it is possible to use 2-6 nuclei obtained by formalin condensation of at least one type of phenol selected from the group consisting of phenol, m-creosol, 2,5-xylenol.

A carboxy compound including a carboxy group configuring component (C) by protecting with the acid-cleavable dissolution inhibiting group includes for example biphenyl carboxylic acid, naphthalene (di) carboxylic acid, benzoyl benzoic acid, anthracenecarboxylic acid, or the like.

The acid-cleavable dissolution inhibiting group that protects the hydroxyl groups or carboxy groups in the phenol compounds or the carboxylics includes for example a tertiary alkyl oxy-carbonyl group such as a tertiary butyl oxy-carbonyl group or a tertiary amyl oxy-carbonyl group, a tertiary alkyl group such as a tertiary butyl group or tertiary amyl group, a tertiary alkoxycarbonyl alkyl group such as a tertiary butyl oxy-carbonyl methyl group, or a tertiary amyl oxy-carbonyl methyl group, a cyclic ether group such as a tetrahydropyranyl group or a tetrahydrofuranyl group, or the like.

Suitable compounds for the component (C) protect 4 nuclei obtained by condensing a formalin condensate with 2,5-xylenol using a tertiary alkoxycarbonyl alkyl group.

The components (C) above may be used singly or as a mixture of two or more. The content of the component (C) is preferably from 1 mass % to 30 mass % relative to the component (A), and more preferably 1-20 mass %. A sufficient dissolution inhibiting effect is obtained in that range. Furthermore pattern formation is superior.

Solvent (D)

There is no particular limitation on the solvent as long as components (A) to (E) can be dissolved, and for example the following substances may be used: alcohols (for example, 2-propanol, methanol, ethanol, n-butanol), ethers (for example, diethylether, MTBE, THF, or the like), hydrocarbons (for example, octane, n-hexane, cyclohexane, benzene, toluene, xylene, or the like), dimethyl sulfoxide, N,N-dimethylformamide, halogens (chloroform, dibromomethane, dichloromethane, or the like), ketones (acetone, methylethylketone (MEK), acetylacetone (AcAc), γ-butyrolactone, cyclohexanone, 2-heptanone, or the like), ethyl acetate, ethyl lactate, propylene glycol monomethyl ether acetate, propylene glycol mono methyl ether, 3-methoxybutyl acetate, water, or the like.

Ligands shown as compounds in Formulae 28 to 29, and in particular in Formulae 30 to 40 demonstrate superior dissolution in organic solvents including ethyl lactate (EL), γ-butyrolactone (GBL), N,N-dimethylformamide (DMF), and the like, are suitable for patterning, and are particularly suitable for use in the present invention. Of these compounds, a complex having a ligand as shown in Formula 31 or Formula 40 is preferred since it dissolves in EL when used in isolation.

There is no particular limitation on the used amount of component (D), and the amount may be suitably set in response to the coated film thickness at a concentration that can be coated on the substrate or the like. More precisely, the solid concentration of the positive-type photosensitive composition is used in the range of 3 mass % to 40 mass %, and preferably 5 mass % to 30 mass %.

Other (E)

The positive-type photosensitive composition according to the present invention may contain various additives including a surface active agent, a sensitizing agent, an anti-foaming agent, or the like. However it is preferred that the composition substantially does not contain a photosensitive resin.

The surface active agent may be a known substance, and includes compounds such as anionic compounds, cationic compounds, non-ionic compounds, or the like. More precisely, the surface active agent may be X-70-090 (Tradename, Shinetsu Chemical Co., Ltd.) or the like. It is possible to improve the coating performance and the evenness by addition of a surface active agent. The sensitizing agent may be a substance used in relation to known conventional positive-type resists. For example, this includes a compound having a phenolic hydroxyl group with a molecular weight of 1000 or less. The anti-foaming agent may be a known conventional substance, and includes silicone based compounds or fluorine based compounds.

Method of Formation of Patterned Metal Compound Film

A method will be described below of forming a metal compound film that is patterned using the positive-type photosensitive composition above. The positive-type photosensitive composition according to the present invention is obtained by using known conventional methods to prepare component (A) and component (B), and as required component (C) to component (E).

Firstly in a coating step, the positive-type photosensitive composition according to the present invention is coated and dried onto a support such as a substrate or the like using a spinner, roll coater, spray coater, slit coater or the like, to thereby form a photosensitive composition layer.

In an exposure step, exposure was performed using a pre-determined mask. Exposure is performed by illumination of active energy radiation such as ultraviolet rays, excimer laser light, or the like. The light source of the active energy radiation includes for example a low-pressure mercury lamp, a high-pressure mercury lamp, an ultra-high-pressure mercury lamp, a chemical lamp, an excimer laser, or the like.

Then, in a development step, the exposed photosensitive layer is developed using a developing liquid to thereby form a pattern. The developing liquid is preferably an alkali developing liquid, and may use an aqueous solution of tetramethylamonium hydroxide (hereafter referred to as "TMAH") at 0.01 mass % to 10.0 mass %, and preferably 0.1 mass % to 5 mass %.

As described below in the examples, the pattern resolution obtained by the present invention results in excellent resolution which compares favorably even to resolution resulting from addition of a photosensitive resin as in Patent Document 2.

Thereafter, the patterned photosensitive composition layer is processed by baking for example to obtain a metal compound film pattern having a composition formula as shown in Formula 41. The baking temperature is suitably in the range of 250 to 1800° C. When greater than or equal to 250° C., a hard, dense film can be formed. When component (A) is a compound as shown in Formula 1 to Formula 29 above, the baking temperature is preferably a low temperature of the level of 250° C., and therefore a metal compound film pattern can be formed even on a surface of a material which is affected by heat.

Furthermore even when the substrate is soda glass, it is possible to form a metal compound film pattern without an undercoat. The baking temperature can be adjusted in response to the type of metal M, and the crystalline phase of the target metal compound film.

$$M\left(O_{\frac{1-x-y}{2}}X_{5\frac{x}{l}}X_{6\frac{y}{m}}\right)_n \qquad \text{Formula 41}$$

Herein $X_5$ and $X_6$ in Formula 41 may be any of O, N, and S contained in $X_1$ to $X_4$ above. 1, m and n are the respective valences of $X_5$, $X_6$, and M. Furthermore x and y are the content ratios of $X_5$, $X_6$ in the metal compound above, and the total of x and y takes a value not exceeding 1.

When using Ti as M, a thin film using a metal compound formed using the coating liquid according to the present invention (M in Formula 28 being Ti) demonstrates a photocatalytic action. Herein when either of $X_5$, $X_6$ is O (when using $TiO_2$), a photocatalytic action is demonstrated in the long wavelength band of ultraviolet light. When at least one of $X_5$, $X_6$ is S or N, it is possible that a photocatalytic action is demonstrated at a different wavelength band (for example the region of visible light). When using a combination of In and Sn, a combination of Ga and Zn, or a combination of Nb and Ti as M, if O is used as $X_5$ and $X_6$, the metal oxide thin film (ITO, Ga—ZnO, Nb—$TiO_2$) formed using the coating liquid according to the present invention demonstrates a function as a transparent conductive film. The transparent conductive film may be preferably used as an electronic device used in a thin display, or a photovoltaic panel. When using Sn as M, if O is used as $X_5$ and $X_6$, the metal oxide thin film ($SnO_2$) formed using the coating liquid according to the present invention demonstrates a heat shielding action as a Low-E film. When using V as M and O is used as $X_5$ and $X_6$, if a metal oxide thin film ($V_2O_5$) formed using the coating liquid according to the present invention is formed on a glass surface, a dimming glass can be prepared. When using Nb as M, the metal oxide thin film formed using the coating liquid according to the present invention displays ultrahigh hydrophilicity.

EXAMPLES

Example 1

A positive-type photosensitive composition according to the present invention was prepared by mixing component (A) and component (B).

Component (A): a solution was prepared by dissolving 16.5 g of catechol in 200 ml of xylene, and then mixing with 29.2 g of indium acetate finely pulverized using a mortar. The mixed liquid was subjected to refluxing for 1 hour, and then was distilled at 132° C. until the amount of the mixed liquid was reduced by half. After distillation, the volatile components in the residual mixed liquid were distilled under reduced pressure in a rotary evaporator. The residual solid component was heated at 100° C. in a vacuum using a vacuum drying apparatus to obtain an indium compound powder by complete removal of the residual volatile components. The recovered amount of solids was 27.7 g.

As described above, a tin compound powder was obtained by an operation that is the same as that described above with the exception that 50 ml of xylene was used in substitution for 200 ml of xylene, and 5.5 g of catechol was substituted for 16.5 g of catechol, and 10.3 g of tin (IV) butoxide was substituted for 29.2 g of indium acetate. The recovered amount of solids was 8.38 g.

A mixture of 935.7 mg of the indium compound powder and 62.9 mg of the tin compound powder was dissolved in a solvent (D) which is a 1:1 mixture of 5 ml of acetyl acetone and toluene, to obtain a solution having a metal ion concentration of 0.71 M (Formula 6 and Formula 14).

Bis(2-methyl-4-hydroxy-5-cyclohexylphenyl)-3,4-dihydroxyphenyl methane-1,2-naphthoquinone diazide-5-sulfonic acid ester (Formula (b)-1 below), which is the component (B), is added to the above solution (solid concentration of 17.9 mass %) so that the ratio of component (B) to component (A) expressed as a solid content ratio is 40 mass % (Example 1), 20 mass % (Example 2), and 10 mass % (Example 3), and then filtered in a 0.25 μm membrane filter to obtain the positive-type photosensitive composition in the examples. A substance not including component (B) was used in the comparative examples.

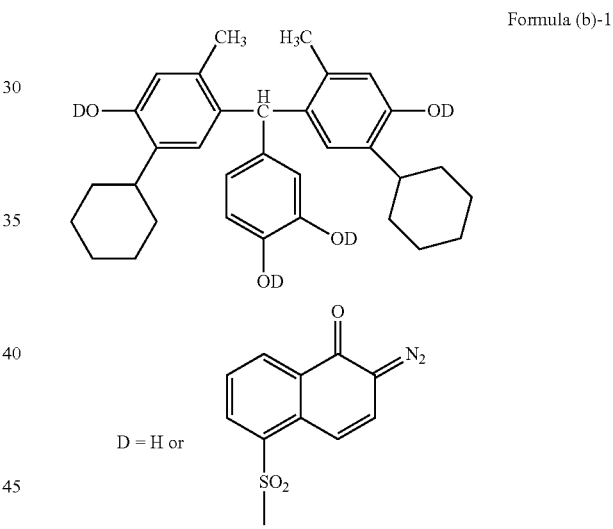

Formula (b)-1

Test Example 1

Dissolution Inhibition Effect

The Examples 1 to 3 and the comparative example were spin coated at 750 rpm×20 seconds onto a 3-inch silicon wafer and prebaked at 100° C. for 1 minute to form a photosensitive composition layer having a film thickness of 2000 nm. In that state, the wafer was immersed in 2.38 mass % tetramethyl ammonium hydroxide (TMAH) at 23° C. and the dissolution velocity (nm/s) was measured. As a result, Example 1 displayed a dissolution velocity of 80 nm/s, Example 2 displayed a dissolution velocity of 70 nm/s, Example 3 displayed a dissolution velocity of 60 nm/s, in contrast to the dissolution velocity of 130 nm/s of the comparative example and thereby confirms the dissolution inhibition effect in the Examples.

Test Example 2

Patterning

In the same manner as Test Example 1, a photosensitive composition layer was formed in relation to Example 1, and then contact exposure was performed using an ultra-high-pressure mercury lamp with an illumination of 13 mW/cm$^2$ through a mask pattern. Development was performed for 30 seconds in 2.38% TMAH, and postbaking at 90° C. for one minute. As a result, a 50 μm line pattern was enabled at 500 mJ/cm$^2$ exposure in Example 1. Furthermore sufficient adhesive properties were enabled by patterning to a 4 μm line using a dose amount of 1000 mJ/cm$^2$. An ITO metal oxide thin film was obtained by baking the resulting pattern for one hour at 900° C. (temperature increase 10° C./min, natural cooling).

Test Example 3

Added Amount of Photosensitizing Agent

Patterning was performed in the same manner as Test Example 2 by changing the developing conditions and exposure conditions in relation to Examples 1 and 2. As a result, in Example 2, a 4-μm line patterning was enabled using conditions of a dose amount of 1000 mJ/cm$^2$, 2.38 mass % of TMAH and 20 seconds. In Example 3, a 4-μm line patterning was also enabled using conditions of a dose amount of 500 mJ/cm$^2$, 1.29 mass % of TMAH and 30 seconds. In this manner, it has been shown that high resolution patterning is sufficiently enabled even when a small added amount such as 10 mass % of a photosensitizing agent is used in the present invention.

Examples 2 to 19

The positive-type photosensitive composition according to the present invention was prepared by mixing component (A), component (B), and component (D) in the proportions shown in Table 1 below. Component (A) was synthesized using the same method as Example 1 with the exception that 1-methyl-2-pyrolidone was used as a solvent in substitution for xylene in Example 1. In Examples 5, 7-15, 18, and 19, in substitution for indium acetate, a mixture of indium acetate and tin (II) acetate in a molar ratio of 18:1 was added so that the total amount of indium and tin displayed a molar ratio of 1:1 in relation to the ligand. In Example 2, tin (IV) acetate, and in Example 3, tin (II) acetate was added so that the molar ratio of tin:ligand was 1:2. In Example 16, titanium tetra-iso-propoxide was added so that the molar ratio of titanium and ligand was 1:2. In Example 17, a mixture of tin (II) acetate and tantalum (V) pentaethoxide were mixed in a molar ratio of 97.5:2.5 and added so that the total amount of tin and tantalum displayed a molar ratio of 1:1.025 in relation to the ligand. Component (B) which is the photosensitizing agent is the same substance as Example 1 in Examples 2-18. The photosensitizing agent used in Example 19 is a compound in which 3.5 moles of naphthoquinone diazide are added to the hydroxide group of 2,3,4,4'-tetrahydroxybenzophenone as shown in Formula (b)-2 below. The method of preparing the composition was performed in accordance with Example 1. The evaluation of the resolution due to patterning and the film thickness was performed in accordance with Test Examples 1 and 2. The development temperature was 23° C. The results are summarized in Table 2. Examples 8 and 12 were baked according to Test Example 2, and the resistance value was measured.

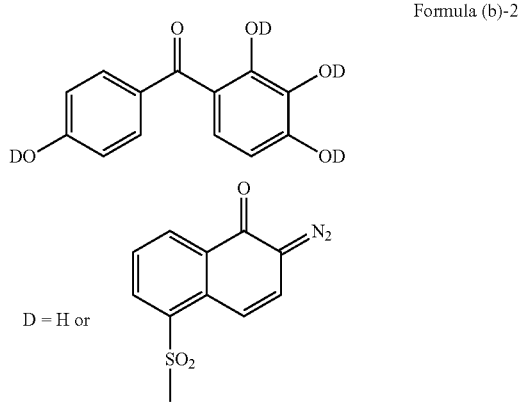

Formula (b)-2

D = H or

TABLE 1

| | (A) Metal Complex | | | (B) Photosensitizing Agent | (D) Organic Solvent (parts by mass) | | |
|---|---|---|---|---|---|---|---|
| | Ligand | M type | parts by mass | (parts by mass) | DMF | GBL | EL |
| Example 2 | Formula 32 | Sn(IV) | 100 | 250 | — | 800 | 252 |
| Example 3 | Formula 32 | Sn(II) | 100 | 250 | 600 | — | 200 |
| Example 4 | Formula 38 | In | 100 | 250 | 820 | — | 650 |
| Example 5 | Formula 31 | InSn | 100 | 100 | 164 | — | 652 |
| Example 6 | Formula 32 | In | 100 | 100 | 232 | — | 232 |
| Example 7 | Formula 30 | InSn | 100 | 100 | 230 | — | 530 |
| Example 8 | Formula 39 | InSn | 100 | 50 | 175 | — | 175 |
| Example 9 | Formula 34 | InSn | 100 | 50 | 175 | — | 175 |
| Example 10 | Formula 35 | InSn | 100 | 50 | 175 | — | 175 |
| Example 11 | Formula 35 | InSn | 100 | 50 | 175 | — | 175 |
| Example 12 | Formula 36 | InSn | 100 | 50 | 175 | — | 175 |
| Example 13 | Formula 37 | InSn | 100 | 50 | 175 | — | 175 |
| Example 14 | Formula 40 | InSn | 100 | 50 | 250 | — | 250 |
| Example 15 | Formulae 35 and 40 | InSn | 100 | 50 | — | 100 | 400 |
| Example 16 | Formula 35 | Ti | 100 | 50 | 140 | — | 400 |
| Example 17 | Formula 33 | SnTa | 100 | 50 | 100 | — | 400 |
| Example 18 | Formulae 31 and 40 | InSn | 100 | 50 | — | — | 250 |
| Example 19 | Formula 31 | InSn | 100 | 50 | 250 | — | 250 |

TABLE 2

|  | Resolution (μm) | Dose Amount (mJ/cm$^2$) | Film Thickness (nm) | Developing Liquid (TMAH) Concentration (mass %) | Development Time (seconds) | Resistance Value (kohm/sq) |
|---|---|---|---|---|---|---|
| Example 2 | 50-μm L/S, 1:4 | 914 | 752 | 2.0 | 60 | — |
| Example 3 | 50-μm L/S, 1:4 | 3656 | 2121 | 2.0 | 60 | — |
| Example 4 | 50-μm L/S, 1:4 | 914 | 556 | 2.0 | 60 | — |
| Example 5 | 5-μm L/S, 1:4 | 500 | 1287 | 2.0 | 60 | — |
|  | 6-μm L/S, 1:1 |  |  |  |  |  |
| Example 6 | 5-μm L/S, 1:4 | 500 | 981 | 0.2 | 20 | — |
|  | 6-μm L/S, 1:1 |  |  |  |  |  |
| Example 7 | 15-μm L/S, 1:4 | 1000 | 399 | 2.0 | 60 | — |
|  | 6-μm L/S, 1:1 |  |  |  |  |  |
| Example 8 | 15-μm L/S, 1:4 | 1000 | 1075 | 0.2 | 45 | 2.62-3.83 |
| Example 9 | 15-μm L/S, 1:4 | 1000 | 1149 | 0.1 | 120 | — |
| Example 10 | 5-μm L/S, 1:4 | 1000 | 1270 | 0.1 | 120 | — |
| Example 11 | 10-μm L/S, 1:4 | 1000 | 1026 | 0.1 | 120 | — |
| Example 12 | 5-μm L/S, 1:4 | 1000 | 1695 | 2.0 | 30 | 17.3 |
| Example 13 | 5-μm L/S, 1:4 | 1000 | 1524 | 0.2 | 80 | — |
|  | 6-μm L/S, 1:1 |  |  |  |  |  |
| Example 14 | 5-μm L/S, 1:4 | 4000 | 311 | 0.1 | 120 | — |
| Example 15 | 5-μm L/S, 1:4 | 4000 | 903 | 0.1 | 180 | — |
|  | 6-μm L/S, 1:1 |  |  |  |  |  |
| Example 16 | 5-μm L/S, 1:4 | 4000 | 697 | 0.1 | 60 | — |
|  | 6-μm L/S, 1:1 |  |  |  |  |  |
| Example 17 | 5-μm L/S, 1:4 | 4000 | 883 | 0.1 | 60 | — |
| Example 18 | 5-μm L/S, 1:4 | 4000 | 997 | 0.1 | 60 | — |
| Example 19 | 5-μm L/S, 1:4 | 4000 | 626 | 0.1 | 60 | — |
|  | 6-μm L/S, 1:1 |  |  |  |  |  |

As shown in Table 2, a high-resolution patterning was enabled for all of Example 2 to Example 19. A sufficient resistance value was obtained in Examples 8 and 12, and thereby enables use as a patterned transparent conductive film.

The invention claimed is:

1. A positive-type photosensitive composition comprising a metal complex component (A) enabling formation of a metal compound film, and a photosensitizing agent (B), wherein a ligand of the component (A) is a multidentate ligand having a skeleton formed from an aromatic compound, wherein the photosensitizing agent (B) includes a compound that condenses a compound containing a quinone diazide group and a compound containing a phenolic hydroxyl.

2. The positive-type photosensitive composition according to claim 1, wherein the aromatic compound is an aromatic hydrocarbon that may include a substitution group, or a heteroaromatic compound that may include a substitution group.

3. The positive-type photosensitive composition according to claim 2, wherein the aromatic hydrocarbon or the heteroaromatic compound includes at least one compound selected from a group consisting of a five-membered cyclic compound, a six-membered cyclic compound, and a condensed ring compound of these compounds.

4. The positive-type photosensitive composition according to claim 1, wherein the component (A) is at least one compound selected from the group consisting of a metal complex $A_1$ represented by Formula 1 below, a metal complex $A_2$ represented by Formula 2 below, a metal complex $A_3$ represented by Formula 3 below, a metal complex $A_4$ represented by Formula 4 below, and a metal complex $A_5$ represented by Formula 5 below:

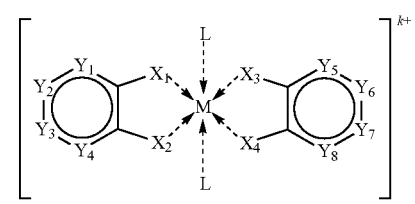

Formula 1

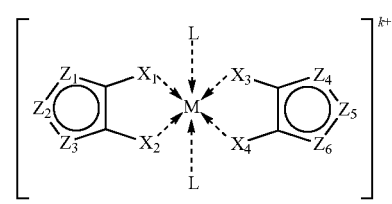

Formula 2

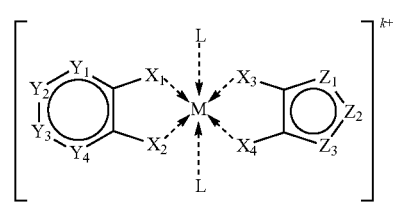

Formula 3

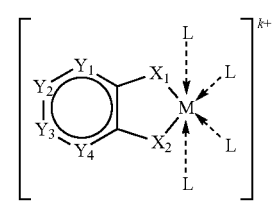

Formula 4

Formula 5

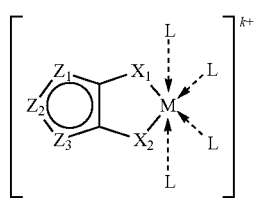

wherein, M in Formula 1 to Formula 5 represents a metal ion, $X_1$-$X_4$ in Formula 1 to Formula 3, and $X_1$-$X_2$ in Formula 4 to Formula 5 respectively represent any of O, NH, $CO_2$, and S, $Y_1$-$Y_8$ in Formula 1, and $Y_1$-$Y_4$ in Formula 3 to Formula 4 respectively represent any of CH, N, O, and a carbon atom including a substitution group, and when carbon atoms are such that $Y_1$-$Y_8$ are adjacent, the adjacent carbon atoms may be in the formation of a condensed ring, $Z_1$-$Z_3$ in Formula 2, Formula 3, and Formula 5, and $Z_4$-$Z_6$ in Formula 2 are respectively configured from one member selected from the group consisting of O, NH, and S, and two members selected from the group consisting of CH, N, O, and a carbon atom including a substitution group, and when carbon atoms are such that $Z_1$-$Z_6$ are adjacent, the adjacent carbon atoms may be in the formation of a condensed ring, L in Formula 1 to Formula 5 represents an axial ligand, and k in Formula 1 to Formula 5 represents the valence of the metal complex, and is equal to the total of the charge of M, $X_1$-$X_4$, and L.

5. The positive-type photosensitive composition according to claim 1, wherein a photosensitizing resin is substantially absent.

6. The positive-type photosensitive composition according to claim 4, wherein the metal M is selected from at least one of the group consisting of Al, Si, Ti, V, Cr, Mn, Fe, Co, Ni, Cu, Zn, Ga, Zr, Nb, In, Sn, Eu, Ta, and Pb.

7. The positive-type photosensitive composition according to claim 4, wherein the metal complex $A_1$ is any one of the metal complexes shown in Formula 6 to Formula 13, or the metal complex $A_4$ is any one of the metal complexes shown in Formula 14 to Formula 21:

Formula 6

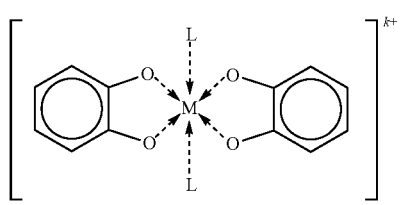

Formula 7

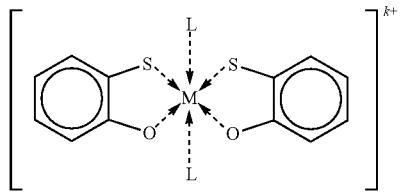

Formula 8

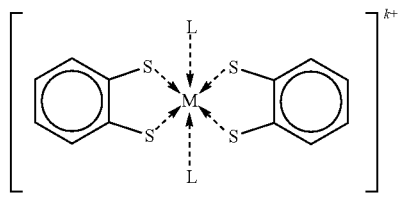

Formula 9

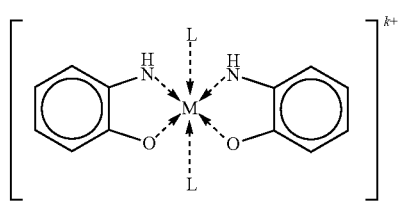

Formula 10

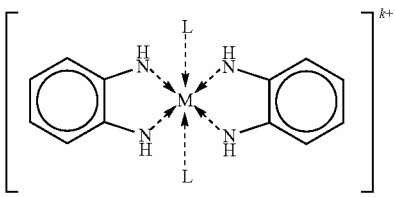

Formula 11

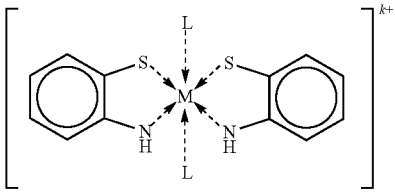

Formula 12

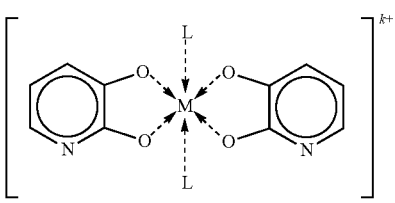

Formula 13

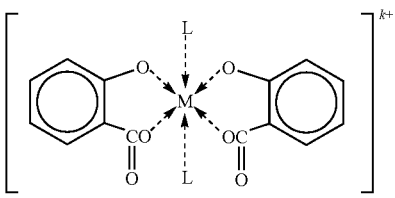

Formula 14

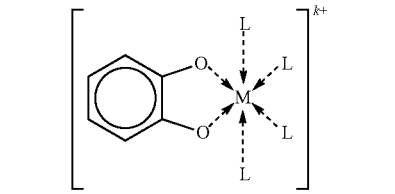

Formula 15

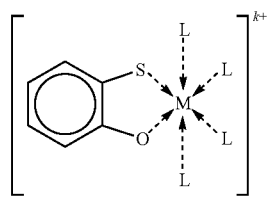

Formula 16

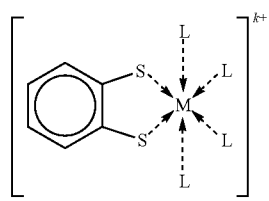

Formula 17

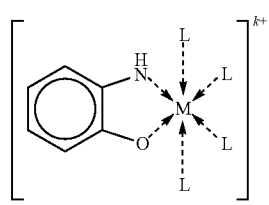

Formula 18

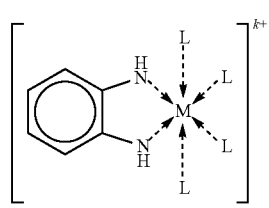

Formula 19

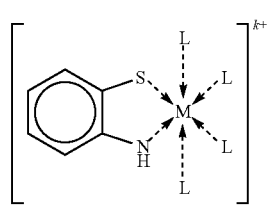

Formula 20

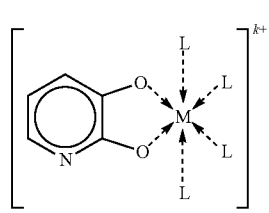

Formula 21

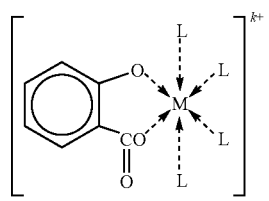

8. The positive-type photosensitive composition according claim 1, wherein the component (A) is an alkali-soluble component.

9. The positive-type photosensitive composition according to claim 1, wherein the ratio of component (B) to component (A) expressed as a solid content ratio is less than or equal to 40 mass %.

10. A positive-type photosensitive composition comprising a metal complex component (A) enabling formation of a metal compound film, a photosensitizing agent (B), wherein a ligand of the component (A) is a multidentate ligand having a skeleton formed from an aromatic compound, and a dissolution inhibitor component (C).

11. A method of manufacture of a metal compound film comprising:
    forming a photosensitive composition layer by coating the positive-type photoresist composition according to claim 1;
    exposing the photosensitive composition layer;
    developing the photosensitive composition layer thus exposed; and
    baking the developed photosensitive composition layer.

12. A method of manufacture of a metal compound film comprising:
    forming a photosensitive composition layer by coating the positive-type photoresist composition according to claim 10;
    exposing the photosensitive composition layer;
    developing the photosensitive composition layer thus exposed; and
    baking the developed photosensitive composition layer.

13. The method of manufacture according to claim 11, wherein the metal compound film is a transparent conductive film.

14. The method of manufacture according to claim 12, wherein the metal compound film is a transparent conductive film.

* * * * *